(12) United States Patent
Lai et al.

(10) Patent No.: US 10,527,788 B2
(45) Date of Patent: Jan. 7, 2020

(54) PACKAGE STRUCTURE AND METHODS OF FORMING SAME

(71) Applicant: Taiwan Semiconductor Manufacturing Company, Ltd., Hsinchu (TW)

(72) Inventors: Jui Hsieh Lai, Taoyuan (TW); Ying-Hao Kuo, Hsinchu (TW); Hai-Ching Chen, Hsinchu (TW); Tien-I Bao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/361,750

(22) Filed: Mar. 22, 2019

(65) Prior Publication Data

US 2019/0219762 A1    Jul. 18, 2019

Related U.S. Application Data

(60) Division of application No. 15/144,294, filed on May 2, 2016, now Pat. No. 10,261,248, which is a
(Continued)

(51) Int. Cl.
*G02B 6/12*      (2006.01)
*H01S 5/026*     (2006.01)
(Continued)

(52) U.S. Cl.
CPC ..... *G02B 6/12004* (2013.01); *G02B 6/12002* (2013.01); *G02B 6/1221* (2013.01);
(Continued)

(58) Field of Classification Search
CPC .... G02B 6/4206; G02B 6/1221; G02B 6/138; G02B 6/12004; G02B 6/42;
(Continued)

(56) References Cited

U.S. PATENT DOCUMENTS 6,670,599 B2 * 12/2003 Wagner ............... H01L 31/12
                                                        250/214.1
6,910,812 B2    6/2005 Pommer et al.
(Continued)

FOREIGN PATENT DOCUMENTS

CN         1818733 A    8/2006
CN       101389988 A    3/2009
(Continued)

OTHER PUBLICATIONS

Noriki, A., et al., "Through Silicon Photonic Via (TSPV) with Si Core for Low Loss and High-Speed Data Transmission in Opto-Electronic 3-D LSI," 2010 IEEE International 3D Systems Integration Conference (3DIC), Nov. 16-18, 2010, pp. 1-4.

*Primary Examiner* — Mohammed R Alam
(74) *Attorney, Agent, or Firm* — Slater Matsil, LLP (57) ABSTRACT

A semiconductor device, a package structure, and methods of forming the same are disclosed. An embodiment is a semiconductor device comprising a first optical device over a first substrate, a vertical waveguide on a top surface of the first optical device, and a second substrate over the vertical waveguide. The semiconductor device further comprises a lens capping layer on a top surface of the second substrate, wherein the lens capping layer is aligned with the vertical waveguide, and a second optical device over the lens capping layer.

20 Claims, 8 Drawing Sheets

Related U.S. Application Data continuation of application No. 14/682,849, filed on Apr. 9, 2015, now Pat. No. 9,335,473, which is a division of application No. 13/874,859, filed on May 1, 2013, now Pat. No. 9,041,015.

(60) Provisional application No. 61/778,354, filed on Mar. 12, 2013.

(51) Int. Cl.
| | |
|---|---|
| *H01S 5/022* | (2006.01) |
| *G02B 6/42* | (2006.01) |
| *G02B 6/122* | (2006.01) |
| *G02B 6/138* | (2006.01) |
| *G02B 6/13* | (2006.01) |
| *H01S 5/183* | (2006.01) |

(52) U.S. Cl.
CPC ............ *G02B 6/13* (2013.01); *G02B 6/138* (2013.01); *G02B 6/42* (2013.01); *G02B 6/4206* (2013.01); *H01S 5/0262* (2013.01); *H01S 5/02248* (2013.01); *H01S 5/02256* (2013.01); *H01S 5/02284* (2013.01); *G02B 6/4246* (2013.01); *G02B 2006/12102* (2013.01); *G02B 2006/12121* (2013.01); *G02B 2006/12123* (2013.01); *H01L 2224/16225* (2013.01); *H01L 2224/32225* (2013.01); *H01L 2224/48091* (2013.01); *H01L 2224/48227* (2013.01); *H01L 2224/48464* (2013.01); *H01L 2224/73265* (2013.01); *H01L 2924/15311* (2013.01); *H01L 2924/181* (2013.01); *H01L 2924/19107* (2013.01); *H01S 5/0228* (2013.01); *H01S 5/02228* (2013.01); *H01S 5/183* (2013.01)

(58) Field of Classification Search
CPC ............ H01S 5/02284; H01S 5/02256; H01S 5/02248; H01S 5/0262; H01S 5/0228; H01S 5/02228; H01L 2924/15311
See application file for complete search history.

(56) References Cited

U.S. PATENT DOCUMENTS

| | | |
|---|---|---|
| 7,335,986 B1 | 2/2008 | Paek et al. |
| 7,942,558 B2 | 5/2011 | Zweig et al. |
| 8,565,279 B2 | 10/2013 | Okumura et al. |
| 8,976,833 B2 | 3/2015 | Lai et al. |
| 9,041,015 B2 | 5/2015 | Lai et al. |
| 2004/0069984 A1 | 4/2004 | Estes et al. |
| 2004/0120672 A1 | 6/2004 | Chong et al. |
| 2004/0126064 A1* | 7/2004 | Vandentop ............. G02B 3/005 385/49 |
| 2004/0178488 A1 | 9/2004 | Bolken et al. |
| 2005/0196094 A1* | 9/2005 | Glebov ................... G02B 6/43 385/14 |
| 2006/0174652 A1 | 8/2006 | Khanarian et al. |
| 2006/0261432 A1 | 11/2006 | Yoshimura et al. |
| 2007/0147459 A1 | 6/2007 | Ueki |
| 2008/0211079 A1 | 9/2008 | Onodera |
| 2008/0247703 A1 | 10/2008 | Kodama et al. |
| 2008/0247704 A1 | 10/2008 | Kodama et al. |
| 2008/0265353 A1 | 10/2008 | Komoguchi et al. |
| 2009/0160002 A1 | 6/2009 | Yun |
| 2009/0243079 A1 | 10/2009 | Lim et al. |
| 2010/0116976 A1 | 5/2010 | Wober |
| 2010/0301438 A1 | 12/2010 | Ogino et al. |
| 2010/0320600 A1 | 12/2010 | Pratt |
| 2012/0020612 A1 | 1/2012 | Ito et al. |
| 2012/0200751 A1 | 8/2012 | Kato et al. |
| 2014/0269804 A1 | 9/2014 | Lai et al. |
| 2014/0269805 A1 | 9/2014 | Lai et al. |

FOREIGN PATENT DOCUMENTS

| | | |
|---|---|---|
| CN | 101471297 A | 7/2009 |
| CN | 102637702 A | 8/2012 |
| JP | 2006049825 A | 2/2006 |
| JP | 2010278276 A | 12/2010 |

\* cited by examiner

PACKAGE STRUCTURE AND METHODS OF FORMING SAME

PRIORITY CLAIM AND CROSS-REFERENCE

This application is a divisional of U.S. patent application Ser. No. 15/144,294, filed May 2, 2016, entitled "Package Structure and Methods of Forming Same," which is a continuation of U.S. patent application Ser. No. 14/682,849, filed Apr. 9, 2015 (now U.S. Pat. No. 9,335,473, issued May 10, 2016), entitled "Package Structure and Methods of Forming Same," which is a divisional of U.S. patent application Ser. No. 13/874,859, filed on May 1, 2013 (now U.S. Pat. No. 9,041,015, issued May 26, 2015), entitled "Package Structure and Methods of Forming Same," which claims the benefit of U.S. Provisional Application No. 61/778,354, filed on Mar. 12, 2013, and entitled "Package Structure and Methods of Forming Same," which applications are hereby incorporated herein by reference in their entireties.

BACKGROUND

The demand for continuous increase in transmission speed, data capacity and data density in integrated optical and optoelectronic circuits has been the motivating force behind numerous innovations in areas of broadband communications, high-capacity information storage, and large screen and portable information display. Although glass optical fibers are routinely used for high-speed data transfer over long distances, they are inconvenient for complex high-density circuitry because of their high density, poor durability, and high cost of fabrication for complex photonic circuits. As such, polymeric materials hold great promise for constructing cost effective, reliable, passive and active integrated components capable of performing the required functions for integrated optical and optoelectronic devices.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a light coupling device with a vertical waveguide and a lens cap for transmitting optical data through a substrate. Other embodiments may also be applied, however, to transmitting data through interposers and other packaging structures.

Figure 1A:
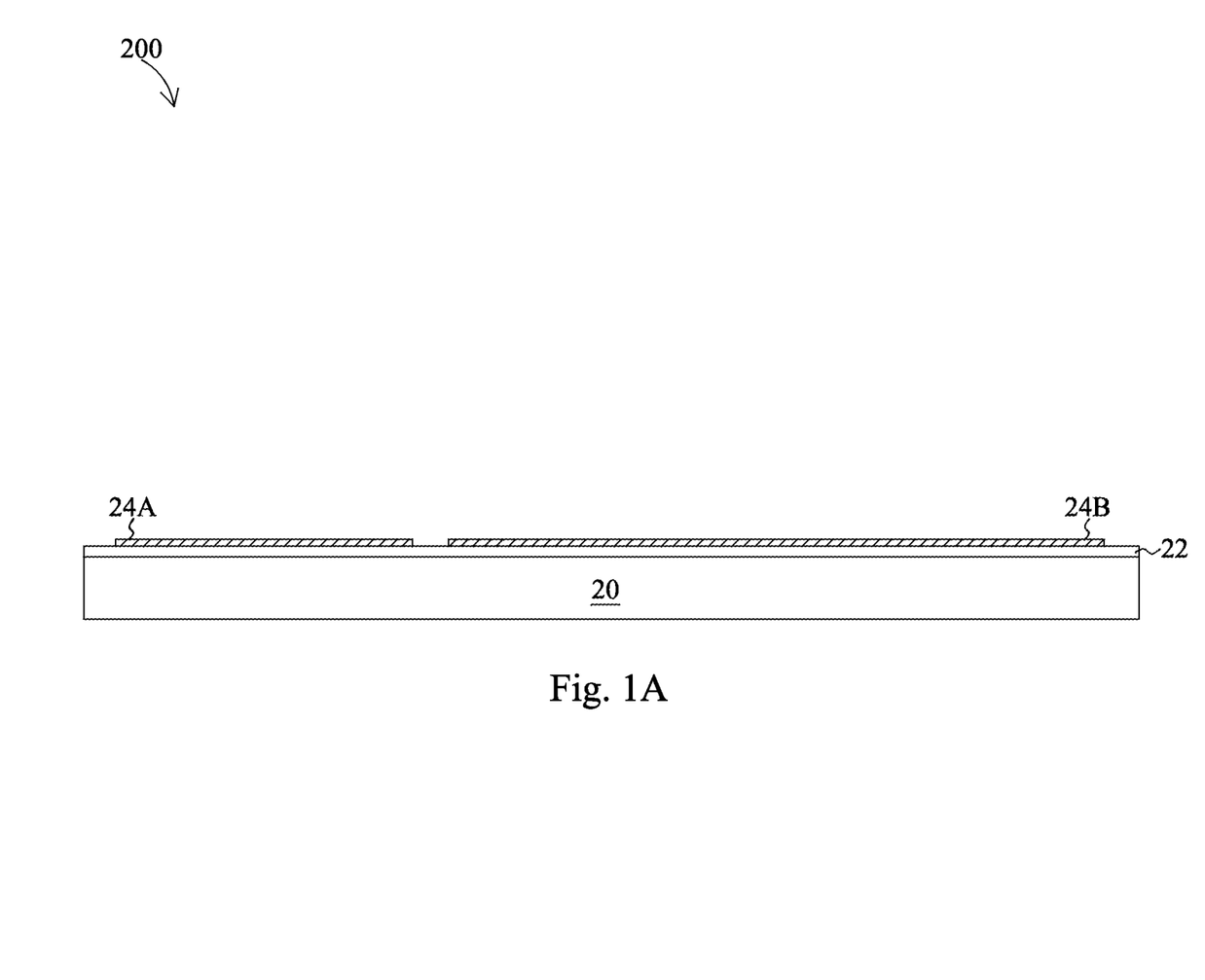
FIGS. 1A through 1F illustrate intermediate stages of forming a semiconductor device according to an embodiment.

With reference now to FIG. 1A, there is shown a semiconductor device 200 at an intermediate stage of processing according to an embodiment. The semiconductor device 200 includes a substrate 20, a passivation layer 22, and a redistribution layer (RDL) 24 over the substrate 20 including a first RDL 24A and a second RDL 24B. The substrate 20 may be any suitable substrate, such as a 1/2/1 laminate substrate, a 4-layer laminate substrate, interposer, packaging substrate, a die/wafer, a printed-circuit board, a high-density interconnect, or the like. The substrate 20 may be silicon, silicon germanium, silicon carbide, gallium arsenide, a ceramic substrate, a quartz substrate, the like, or a combination thereof. The substrate 20 may comprise bulk silicon, doped or undoped, or an active layer of a silicon-on-insulator (SOI) substrate.

The substrate 20 may include integrated circuit devices (not shown). As one of ordinary skill in the art will recognize, a wide variety of integrated circuit devices such as transistors, capacitors, resistors, combinations of these, or the like may be used to generate the structural and functional requirements of the design for the semiconductor device 100. The integrated circuit devices may be formed using any suitable methods.

The substrate 20 may also include an interconnect structure (not shown). The interconnect structure may be formed over the integrated circuit devices and be designed to connect the various integrated circuit devices to form functional circuitry. The interconnect structure may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown) to electrically couple the integrated circuit devices to the RDL 24. Only a portion of the substrate 20 is illustrated in the figures, as this is sufficient to fully describe the illustrative embodiments.

The passivation layer 22 may be formed over the substrate 20. The passivation layer 22 may be made of one or more suitable dielectric materials such as silicon oxide, silicon nitride, low-k dielectrics such as carbon doped oxides, the like, or a combination thereof. The passivation layer 22 may be formed through a process such as chemical vapor deposition (CVD), although any suitable process may be utilized, and may have a thickness between about 0.5 µm and about 5 µm, such as about 9.25 KÅ.

The RDLs 24A and 24B may be formed to extend along the passivation layer 22. The RDLs 24A and 24B may be utilized as a redistribution layer to allow the subsequently formed devices and structures (see FIG. 1D) that are electrically connected to the interconnect structure and/or active and passive devices to be placed in any desired location on the substrate 20, instead of limiting the location of the subsequently formed devices and structures to locations that are directly over the interconnect structure and/or active and passive devices. In an embodiment the RDLs 24A and 24B may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the RDLs 24A and 24B are desired to be located. Alternatively, the seed layer could be patterned before the plating process.

Once the photoresist has been formed and patterned, a conductive material, such as copper, may be formed on the seed layer through a deposition process such as plating. The conductive material may be formed to have a thickness of between about 1 µm and about 10 µm, such as about 5 µm, and a width along the passivation layer 22 between about 5 µm and about 300 µm, such as about 15 µm. However, while the material and methods discussed are suitable to form the conductive material, these materials are merely exemplary. Any other suitable materials, such as AlCu or Au, and any other suitable processes of formation, such as CVD or PVD, may alternatively be used to form the RDLs 24A and 24B.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Figure 1B:
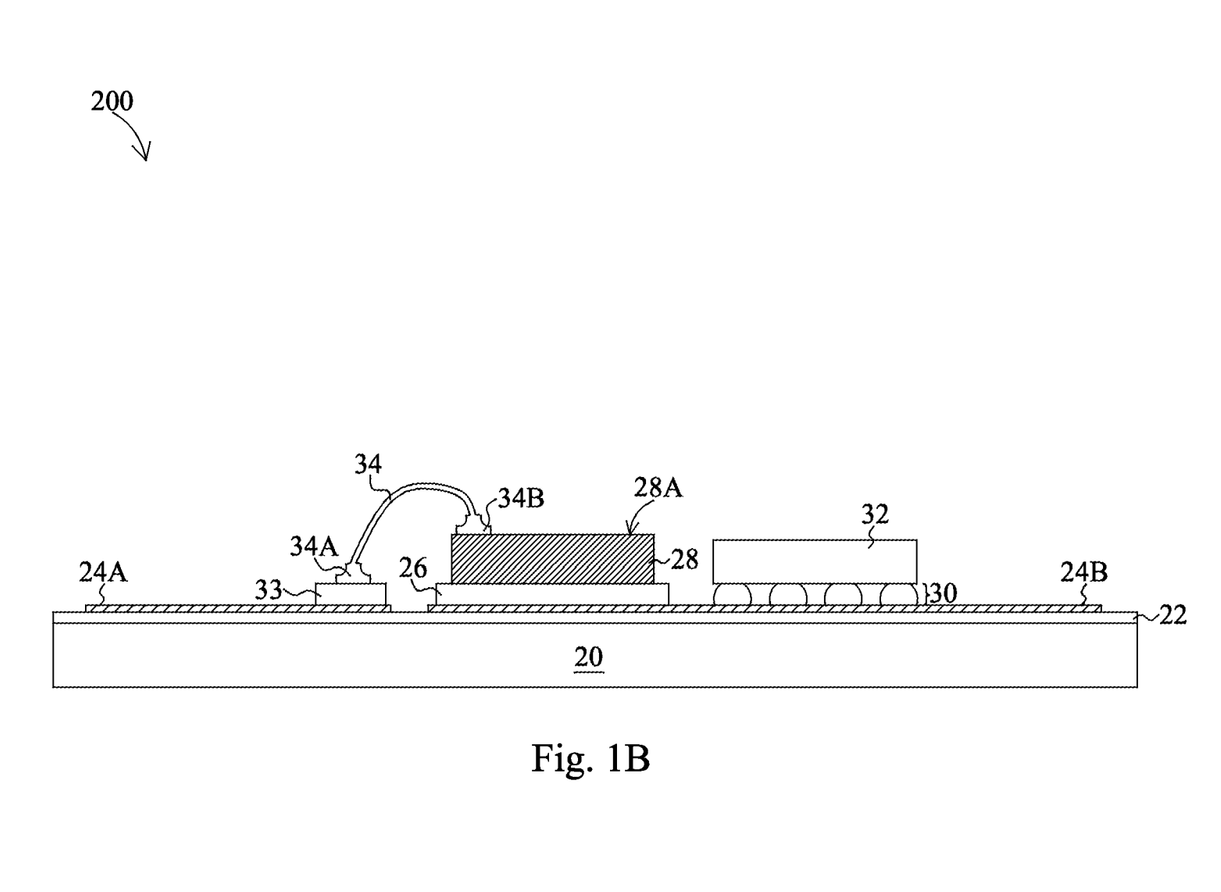

After the RDLs 24A and 24B have been formed, the bonding structure 26, a die 32, and a wire bond 34 may be formed on the RDL 24 as illustrated in FIG. 1B. The bonding structure 26 may be utilized to allow the subsequently formed optical device 28 to be electrically coupled to the RDL 24B. In some embodiments, the bonding structure 26 may be a solder paste, a conductive adhesive, or the like. In other embodiments, the bonding structure 26 may be one or more bond pads, under bump metallizations (UBM), landing pads, metal pillars, metal bumps, the like, or a combination thereof. The bonding structure 26 may comprise copper, aluminum, gold, titanium, nickel, tungsten, the like, or a combination thereof.

The optical device 28 may then be bonded to the bonding structure 26 and the wire bond 34 may be formed to interconnect the optical device 28 and the RDL 24A. The optical device 28 may be coupled to the bonding structure 26 and the wire bond 34 in order to convert an electrical signal to an electromagnetic signal such as light and/or convert an electromagnetic signal such as light into an electrical signal. The optical device 28 may include one or more laser diodes, photo diodes, integrated optical circuits, or other optical components. In some embodiments, the optical device 28 is a vertical-cavity surface-emitting laser (VCSEL) including a photo diode.

The bonding between the optical device 28 and the bonding structure 26 may be a solder bonding or a direct metal-to-metal (such as a copper-to-copper or tin-to-tin) bonding. In an embodiment, the optical device 28 may include one or more bond pads, conductive bumps, and/or pillars and the bonding structuring may include a solder paste or conductive material. In another embodiment, the bonding structure 26 may include one or more UBMs with metal bumps on them and the optical device 28 may have one or more contact pads to couple to the metal bumps. In other embodiments the optical device 28 may be mounted to the bonding structure via a ball grid array, via sockets, via surface mounting technology, or the like.

The wire bond 34 includes a first end 34A and a second end 34B, wherein the first end 34A is coupled to the RDL 24A via a contact pad 33 and the second end 34B is coupled to a top surface 28A of the optical device 28. The wire bond 34 may be utilized to electrically connect the optical device 28 to the active and/or passive devices in the substrates 20 and substrate 50 and/or other devices such as a die 86 (see FIG. 1F). The contact pad 33 may comprise copper, gold, aluminum, nickel, the like, or a combination thereof.

The wire bond 34 may be formed using a wire bonder that includes a capillary for dispensing a metal wire, an electric flame off (EFO) wand, and a transducer, not shown. The wire is inserted into the capillary, which is adapted to control and move the wire during the bonding process. A ball may be formed on the ends of the wire before bonding the wire to the RDL 24A and/or the optical device 28. The ball may then be attached to the contact pad 33 or the top surface 28A of the optical device 28 by pressing with force, vibration (e.g. supersonic), and/or heat the respective end (34A or 34B) of the wire 34 to the contact pad 33 or the top surface 28A. The wire may comprise copper, aluminum, gold, palladium, platinum, the like, or a combination thereof. Alternatively, the wire may comprise other conductive materials and/or metals. In an embodiment, the wire has a diameter in a range from about 18 µm to about 50 µm. In other embodiments, the optical device 28 may be coupled to the RDL 24 using other methods.

The die 32 may be attached to the RDL 24B by a set of conductive joints 30. The die 32 may be a device die comprising integrated circuit devices, such as transistors, capacitors, inductors, resistors (not shown), and the like, therein. Further, the die 32 may be a logic die comprising core circuits, and may be, for example, a central processing unit (CPU) die. In some embodiments, the die 32 may comprise multiple stacked dies like a memory stacking. In some embodiments, the die 32 may have contact pads coupled to the conductive joints 30.

An active surface of the die 32, the active surface comprising the conductive joints 30, is bonded to the RDL 24B. The bonding between the die 32 and the RDL 24B may be a solder bonding or a direct metal-to-metal (such as a copper-to-copper or tin-to-tin) bonding. In an embodiment, the die 32 may be attached to the RDL 24B by a reflow process. In some embodiments, the conductive joints 30 may have a height between about 10 µm and about 60 µm. An optional underfill material (not shown) may be injected or otherwise formed in the space between the die 32 and the RDL 24B. The underfill material may, for example, comprise a liquid epoxy, deformable gel, silicon rubber, or the like, that is dispensed between the die 32 and the RDL 24B, and then cured to harden. This underfill material is used, among other things, to reduce cracking in the first set of conductive joints 30 and to protect the joints from contaminants.

Figure 1C:
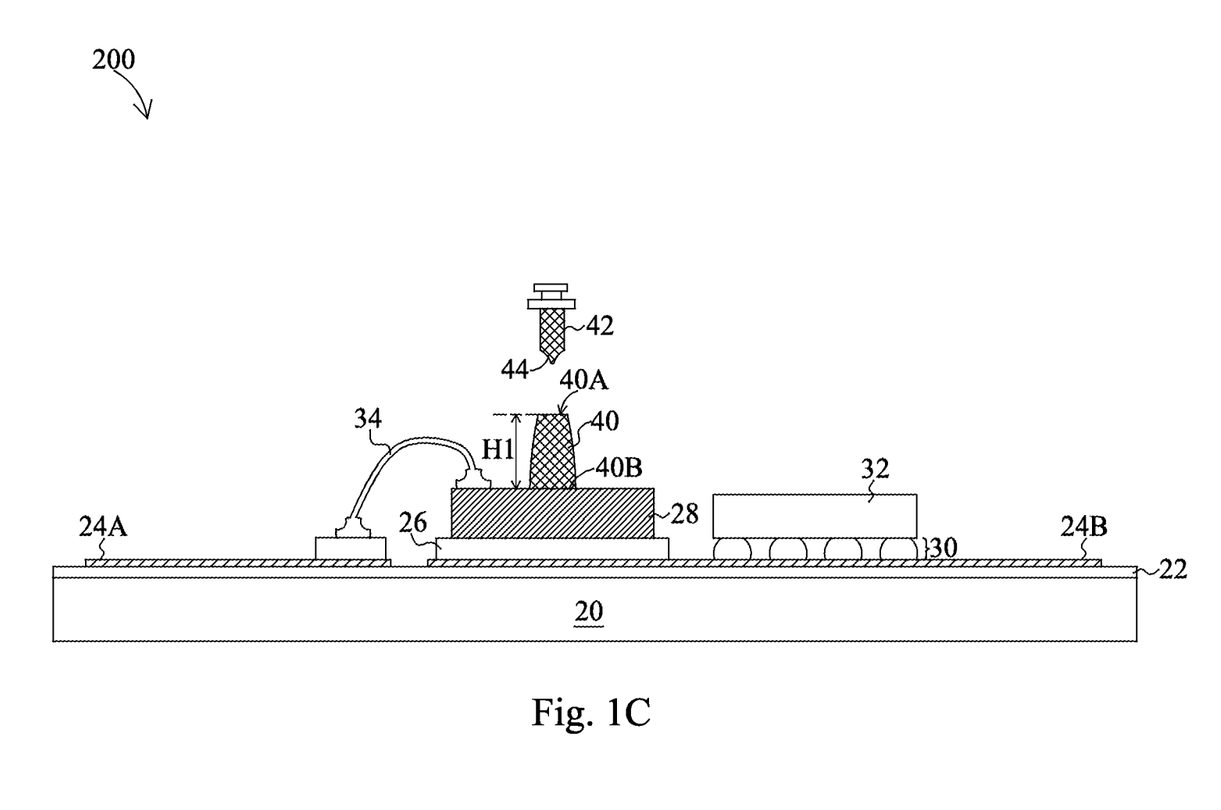

FIG. 1C illustrates the formation of a vertical waveguide 40 on the optical device 28. The vertical waveguide 40 may accept light from a top surface 40A and a bottom surface 40B and channel the light to its desired destination (e.g., the optical device 28 or an external device over the vertical waveguide 40 such as optical device 82 in FIG. 1F). The vertical waveguide 40 may be any type of waveguide, such as a planar waveguide, a channel waveguide, or the like, and may comprise two different materials, a core material and a cladding material, in which the core material has a refractive index higher than the cladding material. An optional refractive index matching material (not shown) may be formed between the bottom 40B of the vertical waveguide 40 and the top surface 28A of the optical device 28. The vertical waveguide 40 has a longitudinal axis from the bottom surface 40B to the top surface 40A, wherein the longitudinal axis is substantially orthogonal to a top surface of the substrate 20. In an embodiment, the longitudinal axis of the vertical waveguide is substantially orthogonal to the top surface 28A of the optical device 28.

As illustrated in FIG. 1C, a dispenser 42 dispenses the waveguide material 44 on to the top surface 28A of the optical device 28 to form the vertical waveguide 40. The waveguide material 44 may be dispensed in a liquid form that has a high viscosity. In some embodiments, waveguide material 44 may be dispensed with a viscosity larger than 30,000 centipoise (cP) per 25 revolutions per minute (rpm) at 25° C. The waveguide material 44 may be dispensed at a temperature from about room temperature (~25° C.) to about 70° C. In an embodiment, the vertical waveguide 40 may be formed to have a height H1 in a range from 50 µm to about 1000 µm. After the dispensing, the waveguide material 44 is fully cured to form the vertical waveguide 40. As illustrated, the vertical waveguide 40 tapers from the bottom surface 40B to the top surface 40A. However, in other embodiments, the vertical waveguide 40 may be columnar and have sidewalls that are substantially orthogonal to a top surface of the substrate 20.

In an embodiment the waveguide material 44, and thus, the vertical waveguide 40 may comprise a combination of polymer materials, such as poly(methylmethacrylate) (PMMA), polystyrene (PS), polycarbonate, polyurethane, benzocyclo butane, perfluorovinyl ether cyclopolymer, tetrafluoroethylene, perfluorovinyl ether copolymer, silicone, fluorinated poly(arylene) ether sulfide, poly(pentafluorostyrene), fluorinated dendrimers, fluorinated hyperbranched polymers, or the like. Alternatively, the vertical waveguide 40 may comprise deuterated and halogenrate polyacrylates, fluorinated polyimides, perfluorocyclobutyl aryl ether polymers, nonlinear optical polymers, or the like.

Figure 1D:
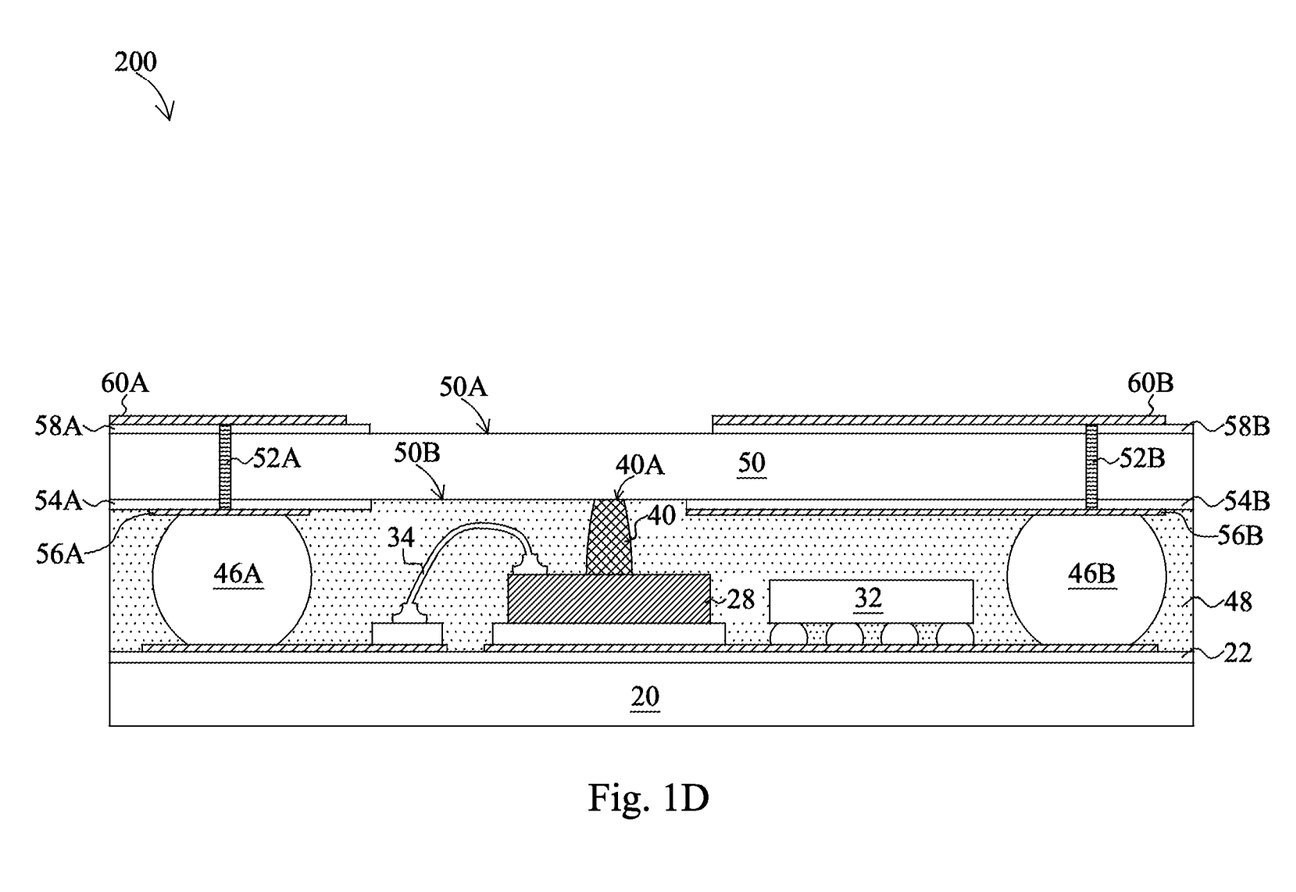

After the vertical waveguide 40 is formed, a substrate 50 may be bonded to substrate 20 with conductive joints 46 (46A and 46B). In some embodiments, the top surface 40A of the vertical waveguide 40 is in direct contact with a bottom surface 50B of the substrate 50. In other embodiments, there may be a small gap between the top surface 40A and the bottom surface 50B. The substrate 50 may be similar to substrate 20 described above and the description will not be repeated herein, although the substrates 50 and 20 need not be the same. In some embodiments, the substrate 50 may comprise silicon, silicon germanium, silicon carbide, a ceramic substrate, a quartz substrate, or the like. In an embodiment, the substrate 50 may have a thickness T1 in a range from about 100 µm to about 400 µm.

The substrate 50 should be transparent to the electromagnetic signal, such as a light signal (see light signal 88 in FIG. 1F) transmitted to or from the optical device 28 at the frequency of the light signal. For example, if the light signal has a frequency above 900 nm, then the substrate 50 may comprise silicon as silicon is transparent to light at a frequency above 900 nm. As another example, if the light frequency is below 800 nm, then the substrate 50 may comprise gallium arsenide as gallium arsenide is transparent to light with a frequency below 800 nm. As a further example, if the light signal is in the visible spectrum (from about 390 nm to about 700 nm), then the substrate 50 may comprise glass as glass is transparent to light in the visible spectrum.

The substrate 50 has passivation layers 54 (54A and 54B) and 58 (58A and 58B) on a top surface 50A and bottom surface 50B of the substrate 50, respectively. The passivation layers 54 and 58 may be similar to the passivation layer 22 described above and the description will not be repeated herein. RDLs 56 (56A and 56B) and 60 (60A and 60B) are formed on the passivation layers 54 and 58, respectively. The RDLs 56 and 60 may be similar to the RDL 24 described above and the description will not be repeated herein. Through substrate vias (TSVs) 52A and 52B extend through substrate 50 interconnecting the RDL 56 and 60. In some embodiments, the substrate 50 may be free from TSVs (see FIG. 2) as discussed below.

The TSVs 52A and 52B may be formed to provide a connection through the substrate 50 to an opposite side of the substrate 50. The TSVs 52A and 52B may be formed by applying and developing a suitable photoresist, and then etching the substrate 50, to generate TSV openings (filled later as discussed below). The openings for the TSVs 52A and 52B at this stage may be formed so as to extend into the substrate 50 to a predetermined depth. The openings for the TSVs 52A and 52B may be formed to have a diameter of between about 1 µm and about 100 µm, such as about 6 µm.

Once the openings for the TSVs 52A and 52B have been formed, the openings for the TSVs 52A and 52B may be filled with, e.g., a barrier layer and a conductive material. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the TSVs 52A and 52B.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the TSVs 52A and 52B. Once the openings for the TSVs 52A and 52B have been filled, excess barrier layer and excess conductive material outside of the openings for the TSVs 52A and 52B may be removed through a grinding process such as chemical mechanical polishing (CMP), although any suitable removal process may be used.

Once the conductive material is within the openings for the TSVs 52A and 52B, a thinning of the second side of the substrate 50 may be performed in order to expose the openings for the TSVs 52A and 52B and form the 52A and 52B from the conductive material that extends through the substrate 50. In an embodiment, the thinning of the second side of the substrate 50 may leave the TSVs 52A and 52B protruding from the second side of the substrate 50. The thinning of the second side of the substrate 50 may be performed by a planarization process such as CMP or etching.

However, as one of ordinary skill in the art will recognize, the above described process for forming the TSVs 52A and 52B is merely one method of forming the TSVs 52A and 52B, and other methods are also fully intended to be included within the scope of the embodiments. For example, forming the openings for the TSVs 52A and 52B, filling the openings for the TSVs 52A and 52B with a dielectric material, thinning the second side of the substrate 50 to expose the dielectric material, removing the dielectric material, and filling the openings for the TSVs 52A and 52B with a conductor may also be used. This and all other suitable methods for forming the TSVs 52A and 52B into the substrate 50 are fully intended to be included within the scope of the embodiments.

Alternatively, the TSVs 52A and 52B may be formed as each of the layers over the substrate 50 are individually formed. For example, the TSVs 52A and 52B may be formed partially concurrently with the passivation layers 54 and 58 and RDLs 56 and 60. For example, a portion of the openings for the TSVs 52A and 52B may be formed and filled within the substrate 50 prior to the formation of the passivation layers 54 and 58, and subsequent layers of the openings for the TSVs 52A and 52B may be formed and filled as each layer of the passivation layers 54 and 58 are formed. Any of these processes, and any other suitable process by which the TSVs 52A and 52B may be formed, are fully intended to be included within the scope of the embodiments.

The conductive joints 46A and 46B may be formed on the RDLs 56A and 56B, respectively. The conductive joints 46A and 46B are illustrated as solder bumps in FIG. 1D, however in other embodiments, the conductive joints 46A and 46B may be solder balls, metal pillars, controlled collapse chip connection (C4) bumps, electroless nickel-electroless palladium-immersion gold technique (ENEPIG) formed bumps, or the like. The conductive joints 46A and 46B may comprise a conductive material such as copper, aluminum, gold, nickel, silver, palladium, tin, the like, or a combination thereof. In an embodiment in which the conductive joints 46A and 46B are tin solder bumps, the conductive joints 46A and 46B may be formed by initially forming a layer of tin through such commonly used methods such as evaporation, electroplating, printing, solder transfer, ball placement, or the like. Once a layer of tin has been formed on the structure, a reflow may be performed in order to shape the material into the desired bump shape. In another embodiment the conductive joints 46A and 46B may be metal pillars (such as copper pillars), which may be pre-formed before the substrate 50 is placed over the substrate 20. The metal pillars may be formed by a plating process and may be solder free and comprise substantially vertical sidewalls.

The bonding between the RDL 56 on the substrate 50, the conductive joints 46, and the RDLs 24 on the first substrate may be a solder bonding or a direct metal-to-metal (such as a copper-to-copper or tin-to-tin) bonding. In an embodiment, the substrate 50 may be bonded to the substrate 20 by a reflow process. During this reflow process, the conductive joints 46 are in contact with the RDLs 56 and 24 to physically and electrically couple the substrate 50 to the substrate 20.

After the substrate 50 is bonded to the substrate 20, an underfill material 48 may be formed between the substrate 50 and the substrate 20 surrounding the conductive joints 46, wire bond 34, the optical device 28, the die 32, and the vertical waveguide 40. The underfill material 48 may be injected or otherwise formed in the space between the substrate 50 and the substrate 20. The underfill material 48 may, for example, comprise a liquid epoxy, deformable gel, silicon rubber, or the like, that is dispensed between the substrate 50 and the substrate 20, and then cured to harden. This underfill material 48 is used, among other things, to reduce cracking in and to protect the conductive joints 46.

Figure 1E:
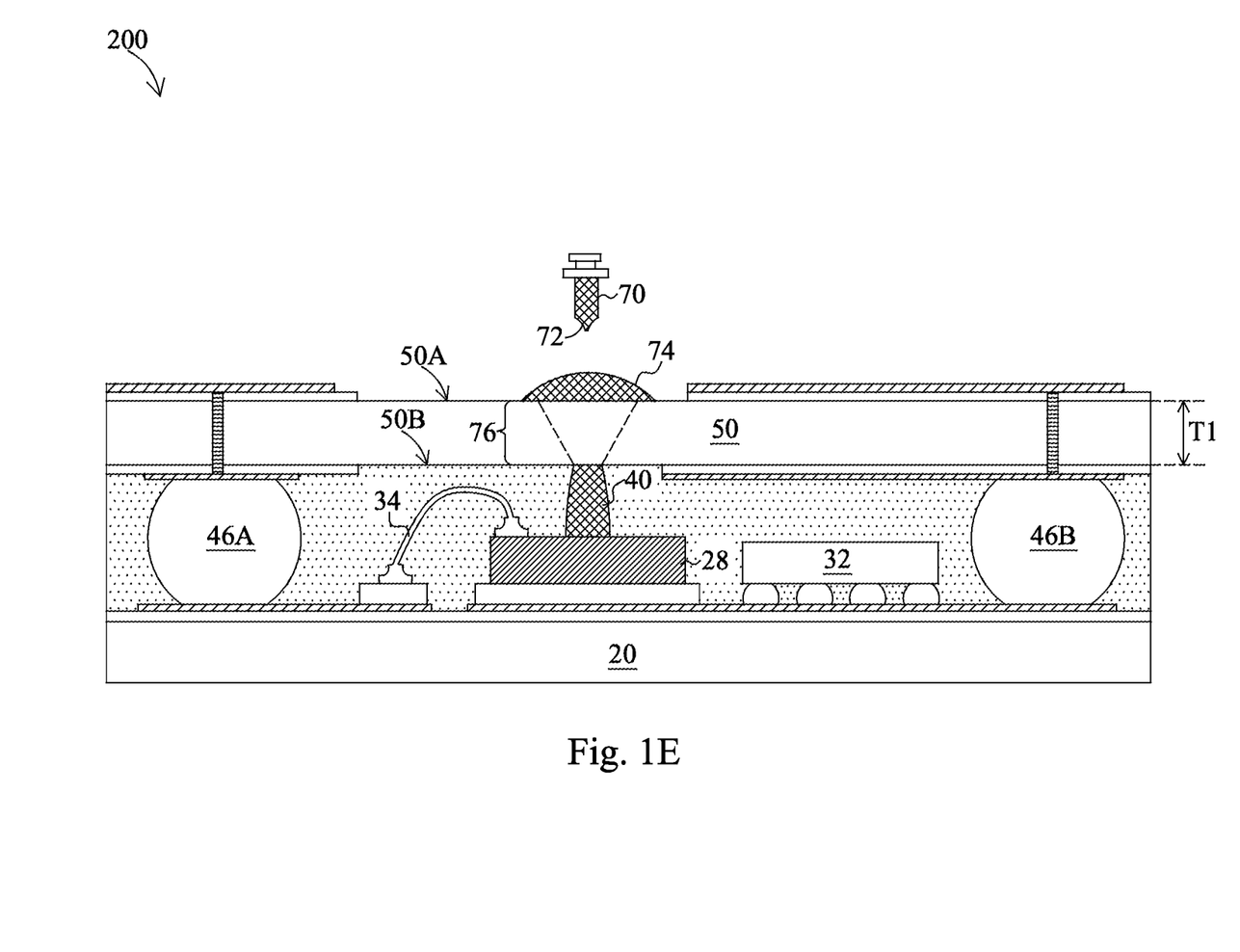

FIG. 1E illustrates the formation of a lens capping layer 74 on a top surface 50A of the substrate 50. The lens capping layer 74 may act as a ball lens for the vertical waveguide 40 with an optical transfer path 76 in the substrate 50 between the vertical waveguide 40 and the lens capping layer 74. The optical transfer path 76 is a portion of the substrate 50 that a light signal (see light signal 88 in FIG. 1F) may be transmitted through to and/or from the vertical waveguide 40 to and/or from the lens capping layer 74. In some embodiments, the optical transfer path 76 comprises the same material as the rest of the substrate 50 and thus does not require any special processing. In some embodiments, optical transfer path 76 may comprise a different material composition than the rest of substrate 50 such that the optical transfer path 76 is transparent to the light signal 88 while the rest of the substrate 50 is not transparent to the light signal 88.

A dispenser 70 dispenses the lens capping material 72 on to the top surface 50A of the substrate 50 to form the lens capping layer 74. The lens capping material 72 may be dispensed in a liquid form that has a high viscosity. In an embodiment, the lens capping layer 74 may be formed to have a height H2 in a range from 30 μm to about 300 μm. After the dispensing, the lens capping material 72 is fully cured to form the lens capping layer 74. The lens capping layer 74 may be a polymer, an epoxy, a molding compound, the like, or a combination thereof. Also, the lens capping layer 74 may comprise similar materials as discussed above for the vertical waveguide 40, although the vertical waveguide 40 and the lens capping layer 74 need not be the same material. In some embodiments, a top surface 74A of the lens capping layer 74 has a rounded or spherical shape. In an embodiment, the refractive index of the vertical waveguide 40 is in a range from about 1.4 to about 1.8, and the refractive index of the lens capping layer 74 is in the range from about 1.4 to about 1.8.

Figure 1F:
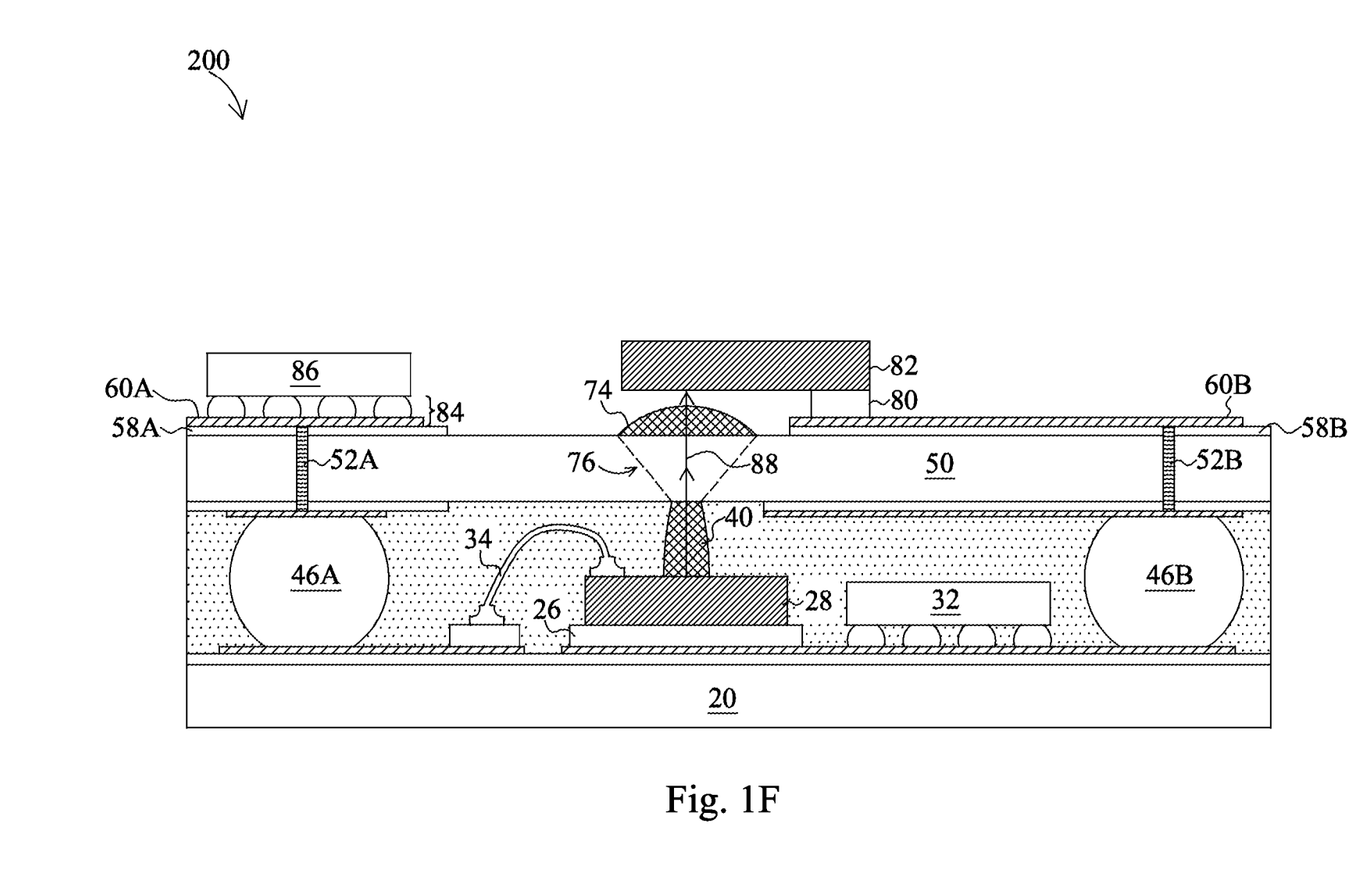

FIG. 1F illustrates the bonding of a die 86 to the RDL 60A and the bonding of an optical device 82 to the RDL 60B by way of a bonding structure 80. Die 86 may be similar to die 32 described above and the description will not be repeated herein, although die 86 and 32 need not be the same. Bonding structure 80 may be similar to bonding structure 26 described above and the description will not be repeated herein, although the bonding structures 80 and 26 need not be the same. Optical device 82 may be similar to optical device 28 described above and the description will not be repeated herein, although the optical devices 82 and 28 need not be the same.

After the optical device 82 is bonded to the bonding structure 80, a light coupling device is formed between the optical device 28 and the optical device 82. In an embodiment, the optical device 28 may be a laser diode configured to transmit a light signal 88 through the vertical waveguide 40, the optical transfer path 76, and the lens capping layer 74 to the optical device 82. In this embodiment, the optical device 82 may be a photodiode configured to receive the transmitted light signal from the optical device 28. In another embodiment, each of the optical devices 28 and 82 may be configured to transmit and receive to form a bidirectional light coupling device.

Although the above embodiment illustrates that lens capping layer 74, bonding structure 80, optical device 82, and die 86 are formed on substrate 50 after substrate 50 is bonded to the substrate 20, this is merely an illustrative process and is not intended to be limiting. For example, in some embodiments, the substrate 50 and attached components 74, 80, 82, and 84 may be formed before substrate 20 and bonded to substrate 20 after they have been formed on substrate 50.

Figure 2:
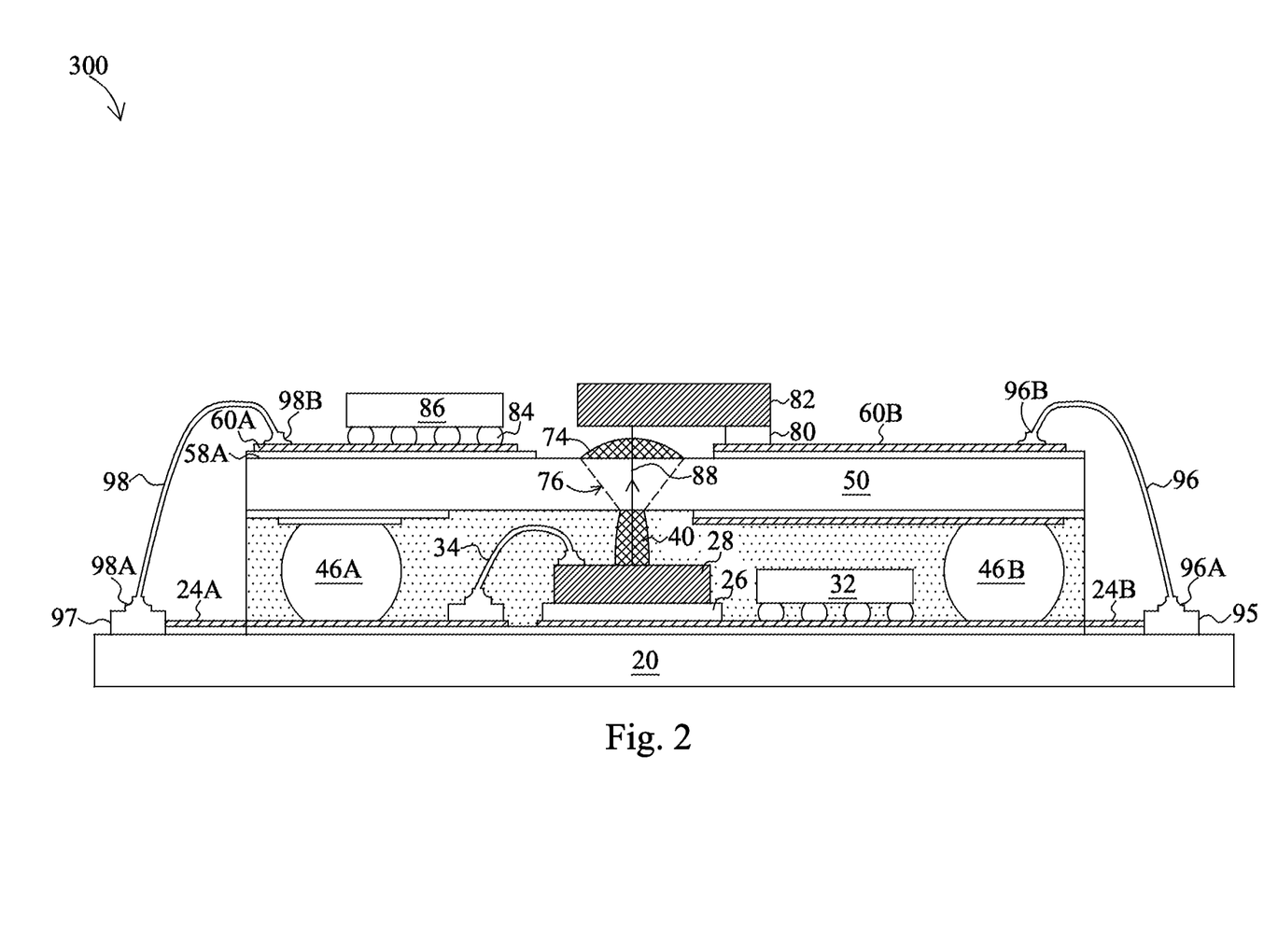
FIG. 2 illustrates a semiconductor device according to an embodiment.

FIG. 2 illustrates a semiconductor device 300 according to an embodiment, wherein the substrate 50 does not include any TSVs. Details regarding this embodiment that are similar to those for the previously described embodiment will not be repeated herein.

In this embodiment, the substrate 20 is electrically coupled to the substrate 50 by wire bonds 96 and 98. Wire bonds 96 and 98 may be similar to wire bond 34 described above, and the formation of the wire bonds will not be repeated herein.

The wire bond 96 includes a first end 96A and a second end 96B, wherein the first end 96A is coupled to the RDL 24A via a contact pad 97 and the second end 96B is coupled the RDL 60A. The wire bond 96 may be utilized to electrically connect the die 86 to the active and/or passive devices in the substrates 20 and substrate 50 and/or other devices such as the optical device 28. The contact pad 97 may comprise copper, gold, aluminum, nickel, the like, or a combination thereof.

The wire bond 98 includes a first end 98A and a second end 98B, wherein the first end 98A is coupled to the RDL 24B via a contact pad 95 and the second end 98B is coupled the RDL 60B. The wire bond 98 may be utilized to electrically connect the optical device 82 to the active and/or passive devices in the substrates 20 and substrate 50 and/or other devices such as the die 32. The contact pad 95 may comprise copper, gold, aluminum, nickel, the like, or a combination thereof.

Figure 3:
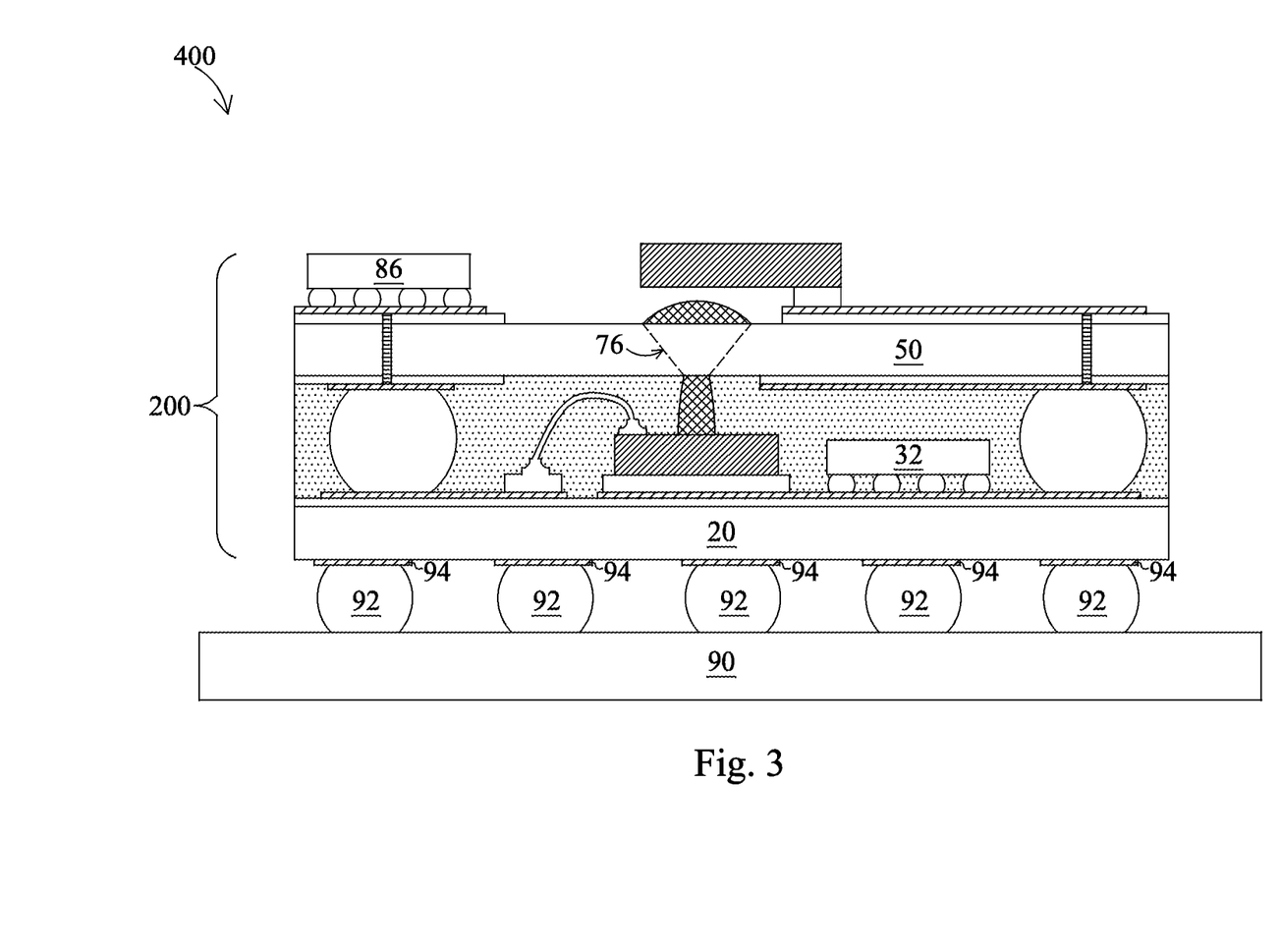
FIG. 3 illustrates a semiconductor device according to an embodiment.

FIG. 3 illustrates semiconductor device 400 according to another embodiment, wherein the semiconductor device 200 is mounted to another substrate through conductive joints. Details regarding this embodiment that are similar to those for the previously described embodiment will not be repeated herein.

The semiconductor device 200 is mounted to a substrate 90 by conductive joints 92. The substrate 90 may be similar to substrates 20 and 50 described above and the description will not be repeated herein, although substrate 90, 20, and 50 need not be the same. In an embodiment, substrate 90 is a package substrate. In some embodiments, the substrate 20 includes TSVs (not shown) similar to TSVs 52 in substrate 50 interconnecting the semiconductor device 200 to the conductive joints 92.

Bond pads 94 may be formed on the backside of the substrate 20. The bond pads 94 may electrically couple conductive joints 92 to the substrate 20. In an embodiment, the bond pads 94 may each include a contact pad and a under bump metallization (UBM). In this embodiment, the contact pad may comprise aluminum, but other materials, such as copper, may alternatively be used. The contact pad may be formed using a deposition process, such as sputtering, to form a layer of material (not shown) and portions of the layer of material may then be removed through a suitable process (such as photolithographic masking and etching) to form the contact pad. However, any other suitable process may be utilized to form the contact pad. The contact pad may be formed to have a thickness of between about 0.5 µm and about 4 µm, such as about 1.45 µm.

Once the contact pad has been formed, the UBM may be formed in electrical contact with the contact pad. In an embodiment the UBM may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the current application.

The UBM may be created by forming each layer using a plating process, such as electrochemical plating, although other processes of formation, such as sputtering, evaporation, or PECVD process, may alternatively be used depending upon the desired materials. The UBM may be formed to have a thickness of between about 0.2 µm and about 10 µm, such as about 5 µm. Once the desired layers have been formed, portions of the layers may then be removed through a suitable photolithographic masking and etching process to remove the undesired material and to leave the UBM in a desired shape, such as a circular, octagonal, square, or rectangular shape, although any desired shape may alternatively be formed. Any suitable structures for bond pads 54A and 54B are fully intended to be included within the scope of the current application.

After the bond pads 94 have been formed, the bumps (illustrated in FIG. 3 after bonding to form conductive joints 92) may be formed on the bond pads. The bumps may comprise a material such as tin, or other suitable materials, such as silver, lead-free tin, copper, or gold. In an embodiment in which the bumps are tin solder bumps, the bumps may be formed by initially forming a layer of tin through such commonly used methods such as evaporation, electroplating, printing, solder transfer, ball placement, or the like, to a thickness of, e.g., about 100 µm. Once a layer of tin has been formed on the structure, a reflow may be performed in order to shape the material into the desired bump shapes. In some embodiments, the substrate 90 includes bond pads (not shown) on top surface to contact the conductive joints 92.

After the formation of the bumps, the bumps may be mounted to the substrate 90 forming conductive joints 92. The semiconductor device 200 may be mounted to the substrate 90 by placing the bumps formed on the bond pads 94 in physical connection with the substrate 90 and then performing a reflow process to reflow the bumps into the conductive joints 92 and to bond the semiconductor device 200 to the substrate 90. In some embodiments, the semiconductor device may be encapsulated on the substrate 90.

The number of bond pads 94 and conductive joints 92 are only for illustrative purposes and are not limiting. There could be any suitable number of bond pads 94 and conductive joints 92.

By forming a light coupling device in a package structure with a vertical waveguide on a first side of a substrate and a lens cap on a second side of the substrate, the efficiency of data transfer is increased over an electrical connection. Further, there is no special processing, such as a through substrate via or a special cladding formation, so the cost of the package structure is lower. Also, the structure of the embodiments allows for wafer level packaging and can reduce the total package size.

An embodiment is a semiconductor device comprising a first optical device over a first substrate, a vertical waveguide on a top surface of the first optical device, and a second substrate over the vertical waveguide. The semiconductor device further comprises a lens capping layer on a top surface of the second substrate, wherein the lens capping layer is aligned with the vertical waveguide, and a second optical device over the lens capping layer.

Another embodiment is a package structure comprising a first redistribution layer over a first side of a first substrate, a first optical device bonded to the first redistribution layer, a vertical waveguide on a top surface of the optical device, a second redistribution layer over the first side of the first substrate, and a wire bond coupling the second redistribution layer to the top surface of the first optical device. The package structure further comprises a second substrate over the first substrate, a second side of the second substrate contacting a top surface of the vertical waveguide, a first conductive joint bonding the first substrate to the second substrate, and a lens cap on a first side of the second substrate, the first side being opposite the second side, the lens cap being aligned with the vertical waveguide.

A further embodiment is a method of forming a semiconductor device, the method comprising, bonding a first optical device to a first side of a first substrate, and forming a vertical waveguide on a top surface of the first optical device. The method further comprises bonding a second side of a second substrate to the first side of the first substrate, the second side of the second substrate being over the vertical waveguide, and forming a lens capping layer on a first side of the second substrate, the first side being opposite the second side.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   dispensing a polymer waveguide on a first surface of a first optical device;
   disposing a first substrate over the polymer waveguide;
   after disposing the first substrate over the polymer waveguide, forming an underfill material on a first surface of the first substrate, the underfill material contacting side surfaces of the first optical device and the polymer waveguide, the underfill material comprising a different material than the polymer waveguide; and
   dispensing a lens layer on a second surface of the first substrate, the second surface of the first substrate being opposite the first surface, a portion of the first substrate being directly between the polymer waveguide and the lens layer.

2. The method of claim 1, further comprising:
   attaching the first optical device to a second substrate, wherein the first substrate is bonded to the second substrate after attaching the first optical device to the second substrate; and
   attaching a second optical device over the second surface of the first substrate.

3. The method of claim 1, wherein the polymer waveguide has a longitudinal axis, the longitudinal axis being substantially orthogonal to the first surface of the first substrate.

4. The method of claim 1, wherein the polymer waveguide and the lens layer have a same material composition.

5. The method of claim 1, wherein a surface of the polymer waveguide is in direct contact with the first surface of the first substrate.

6. The method of claim 1, wherein the dispensing of the polymer waveguide dispenses the polymer waveguide in a liquid form and cures the liquid form.

7. The method of claim 1, wherein the dispensing of the lens layer dispenses the lens layer in a liquid form and cures the liquid form.

8. A method comprising:
   bonding a first optical device on a first side of a first substrate;
   forming a vertical waveguide on a top surface of the first optical device;
   forming a lens capping layer on a first side of a second substrate;
   bonding a second optical device to the first side of the second substrate; and
   bonding a second side of the second substrate opposite the first side of the second substrate to the first side of the first substrate, the second substrate being over the vertical waveguide, the second substrate comprising a first material disposed between the vertical waveguide and the lens capping layer and a second material surrounding the first material, the first material being transparent to a light signal, the second material being opaque to the light signal.

9. The method of claim 8, wherein the lens capping layer is formed on the second substrate and the second optical device is bonded to the second substrate before the second substrate is bonded to the first substrate.

10. The method of claim 8, wherein the lens capping layer is formed on the second substrate and the second optical device is bonded to the second substrate after the second substrate is bonded to the first substrate.

11. The method of claim 8, wherein the underfill is formed after bonding the second side of the second substrate to the first side of the first substrate.

12. The method of claim 8, further comprising forming an underfill between the first substrate and the second substrate, wherein forming the underfill places the underfill in contact with side surfaces of the first optical device and the vertical waveguide, and wherein the underfill comprises a different material from the vertical waveguide.

13. The method of claim 8, wherein the lens capping layer is formed before bonding the second optical device to the second substrate, and wherein a light path passes from the first optical device, through the vertical waveguide, the second substrate, and the lens capping layer, to the second optical device.

14. The method of claim 8, further comprising bonding a first die to the first side of the first substrate, and bonding a second die to the first side of the second substrate.

15. A method comprising:
   forming a first redistribution layer over a first side of a first substrate;
   bonding a first optical device over the first redistribution layer, the first optical device being electrically coupled to the first redistribution layer;
   forming a polymer waveguide on a first surface of the first optical device;
   bonding a second substrate over the first substrate, the second substrate being coupled to the first substrate by a first conductive joint, the second substrate having an optical transfer path, the optical transfer path comprising a first material, the second substrate comprising a second material surrounding the first material, wherein the first material comprises the same material as the second material and the first material is continuous with the second material;

forming a polymer lens layer over the second substrate, the optical transfer path of the second substrate being directly between the polymer waveguide and the polymer lens layer;

forming a second redistribution layer over a first side of the second substrate;

bonding a second optical device over the second redistribution layer, the second optical device being electrically coupled to the second redistribution layer, the second optical device being disposed over the polymer lens layer; and forming a through substrate via extending through the second substrate, the through substrate via coupling the second redistribution layer to the first conductive joint.

16. The method of claim 15, wherein forming the polymer waveguide comprises depositing a liquid polymer waveguide material on the first surface of the first optical device and curing the liquid polymer waveguide material to form the polymer waveguide.

17. The method of claim 15, wherein forming the polymer lens layer comprises depositing a liquid polymer lens layer material on the second substrate and curing the liquid polymer lens layer material to form the polymer lens layer.

18. The method of claim 15, wherein after bonding the second substrate over the first substrate, a surface of the polymer waveguide proximal the second substrate is separated from a surface of the second substrate proximal the polymer waveguide by a gap.

19. The method of claim 15, further comprising after bonding the second substrate over the first substrate, forming an underfill material between the first substrate and the second substrate, the underfill material surrounding the polymer waveguide, the first optical device, and the first conductive joint.

20. The method of claim 15, wherein a refractive index of the polymer waveguide is from 1.4 to 1.8, and wherein a refractive index of the polymer lens layer is from 1.4 to 1.8.

* * * * *